US012757670B2

(12) United States Patent
Yamamura et al.

(10) Patent No.: US 12,757,670 B2
(45) Date of Patent: Oct. 6, 2026

(54) THERMAL TREATMENT APPARATUS, THERMAL TREATMENT METHOD, AND STORAGE MEDIUM

(71) Applicant: Tokyo Electron Limited, Tokyo (JP)

(72) Inventors: Kentaro Yamamura, Koshi City (JP); Shinichiro Kawakami, Koshi City (JP); Toshiki Sagara, Koshi City (JP); Eiichi Matsuoka, Koshi City (JP)

(73) Assignee: Tokyo Electron Limited, Tokyo (JP)

( * ) Notice: Subject to any disclaimer, the term of this patent is extended or adjusted under 35 U.S.C. 154(b) by 850 days.

(21) Appl. No.: 18/040,669

(22) PCT Filed: Sep. 6, 2021

(86) PCT No.: PCT/JP2021/032713
§ 371 (c)(1),
(2) Date: Feb. 6, 2023

(87) PCT Pub. No.: WO2023/032214
PCT Pub. Date: Mar. 9, 2023

(65) Prior Publication Data
US 2024/0234174 A1 Jul. 11, 2024

(51) Int. Cl.
*H10P 72/00* (2026.01)
*H10P 72/78* (2026.01)
*H10P 95/90* (2026.01)

(52) U.S. Cl.
CPC .......... *H10P 72/0432* (2026.01); *H10P 95/90* (2026.01); *H10P 72/78* (2026.01)

(58) Field of Classification Search
CPC ............. H01L 21/67103; H01L 21/324; H01L 21/6838; H01L 21/027; H01L 21/67109;
(Continued)

(56) References Cited

U.S. PATENT DOCUMENTS 7,026,580 B2 * 4/2006 Kao .................... F27B 17/0025 118/724
7,980,003 B2 * 7/2011 Aoki ................. H01L 21/67748 438/584

(Continued)

FOREIGN PATENT DOCUMENTS

JP S63-181321 A 7/1988
JP 2004-260117 A 9/2004

(Continued)

OTHER PUBLICATIONS

International Search Report of the International Searching Authority mailed Nov. 2, 2021 in corresponding International Application No. PCT/JP2021/032713.

*Primary Examiner* — Topaz L. Elliott
(74) *Attorney, Agent, or Firm* — Posz Law Group, PLC

(57) ABSTRACT

A thermal treatment apparatus for thermally treating a substrate on which a coating film of a resist is formed and subjected to an exposure treatment, includes: a hot plate supporting and heating the substrate; a chamber housing the hot plate, the chamber having a ceiling forming thereunder a treatment space for performing the thermal treatment; a gas discharger discharging a treatment gas toward the substrate; a gas supplier supplying gas toward the substrate; a central exhauster exhausting the treatment space from a position close to a center of the substrate; a peripheral exhauster exhausting the treatment space from a side closer to a peripheral edge portion of the substrate; and a controller conducting a control to continue the discharge, supply of gas, and exhaust by the peripheral exhauster during the thermal treatment and enhance the exhaust by the central exhauster from a middle of the thermal treatment.

18 Claims, 10 Drawing Sheets

(58) Field of Classification Search
CPC ......... H01L 21/67098; H01L 21/68785; H01L 21/67178; H01L 21/6719; G03F 7/38; G03F 7/40; F27D 7/04; F27B 17/0025; F27B 17/0083
See application file for complete search history.

(56) References Cited

U.S. PATENT DOCUMENTS

| | | | | |
|---|---|---|---|---|
| 10,217,652 | B2 * | 2/2019 | Mizuta | F27B 3/02 |
| 11,798,821 | B2 * | 10/2023 | Otsuka | H05B 3/22 |
| 2005/0211695 | A1 * | 9/2005 | Kao | F27B 17/0025 219/390 |
| 2007/0169373 | A1 * | 7/2007 | Aoki | F26B 3/20 34/443 |
| 2016/0042984 | A1 * | 2/2016 | Mizuta | H01L 21/67103 432/2 |
| 2016/0172218 | A1 * | 6/2016 | Mizuta | F27D 3/0084 438/795 |
| 2018/0164689 | A1 * | 6/2018 | Sano | H01L 21/6719 |
| 2021/0118707 | A1 * | 4/2021 | Otsuka | F27D 5/0037 |

FOREIGN PATENT DOCUMENTS

| | | | | | |
|---|---|---|---|---|---|
| JP | 2005-129698 | A | | 5/2005 | |
| JP | 2016-530565 | A | | 9/2016 | |
| JP | 2018-137308 | A | | 8/2018 | |
| JP | 2020-129607 | A | | 8/2020 | |
| JP | 2021-019178 | A | | 2/2021 | |
| KR | 100555724 | B1 | * | 3/2006 | H01L 21/6838 |
| KR | 20080058147 | A | * | 6/2008 | H01L 21/67103 |
| KR | 20220107948 | A | * | 8/2022 | H01L 21/6838 |

* cited by examiner

THERMAL TREATMENT APPARATUS, THERMAL TREATMENT METHOD, AND STORAGE MEDIUM

CROSS REFERENCE TO RELATED APPLICATION

This application is a U.S. national stage application of PCT/JP2021/032713 filed on Sep. 6, 2021, the contents of which are incorporated herein by reference.

TECHNICAL FIELD

This disclosure relates to a thermal treatment apparatus, a thermal treatment method, and a storage medium.

BACKGROUND ART

Patent Document 1 discloses a method for patterning a substrate with a radiation ray. This method includes irradiating a coated substrate along a selected pattern to form an irradiation structure having a region of irradiated coating and a region of non-irradiated coating. The coated substrate includes a coating including a metal oxohydroxo network having an organic ligand by metal-carbon bond and/or metal carboxylate bond.

PRIOR ART DOCUMENT

Patent Document

Patent Document 1: Japanese Translation of PCT International Application Publication No. 2016-530565

DISCLOSURE OF THE INVENTION

Problems to be Solved by the Invention

The technique according to this disclosure suppresses the contamination of a substrate by a sublimate produced from a coating film of a resist on the substrate and improves the uniformity within the substrate of a thermal treatment.

Means for Solving the Problems

An aspect of this disclosure is a thermal treatment apparatus for thermally treating a substrate on which a coating film of a resist has been formed and the coating film has been subjected to an exposure treatment, the thermal treatment apparatus including: a hot plate configured to support and heat the substrate; a chamber configured to house the hot plate, the chamber having a ceiling forming thereunder a treatment space in which the thermal treatment is performed, and facing the substrate on the hot plate; a gas discharger provided at the ceiling and configured to discharge a treatment gas toward the substrate on the hot plate from above; a gas supplier configured to supply gas toward the substrate on the hot plate from a lateral side of the substrate on the hot plate and a lower portion of the treatment space; a central exhauster configured to exhaust the treatment space in the chamber from a position close to a center of the substrate on the hot plate in top view on the ceiling; a peripheral exhauster configured to exhaust the treatment space from a side closer to a peripheral edge portion of the substrate on the hot plate than the central exhauster in top view on the ceiling; and a controller, wherein the controller conducts a control so that the discharge by the gas discharger, the supply of the gas by the gas supplier, and the exhaust by the peripheral exhauster are continued during the thermal treatment and the exhaust by the central exhauster is enhanced from a middle of the thermal treatment.

Effect of the Invention

According to this disclosure, it is possible to suppress the contamination of a substrate by a sublimate produced from a coating film of a resist on the substrate and improve the uniformity within the substrate of a thermal treatment.

EMBODIMENTS FOR CARRYING OUT THE INVENTION

In a manufacturing process of a semiconductor device or the like, predetermined treatments for forming a resist pattern on a semiconductor wafer (hereinafter, referred to as a “wafer”) are performed. The predetermined treatments are, for example, a resist coating treatment of supplying a resist solution onto the wafer to form a coating film of the resist, an exposure treatment of exposing the coating film, a PEB (Post Exposure Bake) treatment of heating the coating film after the exposure so as to promote a chemical reaction therein, a developing treatment of developing the exposed coating film, and so on.

The PEB treatment is performed, for example, while an atmosphere around the substrate is being exhausted. In this case, the dimension of a resist pattern may vary within a plane depending on the exhaust mode or the like. Further, in the case of a resist such as a metal-containing resist in which a sublimate is produced, a bevel portion or a rear surface of the substrate may be contaminated by the sublimate depending on the exhaust mode or the like.

Hence, the technique according to this disclosure suppresses the contamination of a substrate by a sublimate produced from a coating film of a resist on the substrate and improves the uniformity within the substrate of a thermal treatment.

Hereinafter, a thermal treatment apparatus and a thermal treatment method according to this embodiment will be explained with reference to the drawings. Note that in this description and the drawings, the same codes are given to elements having substantially the same functional configurations to omit duplicate explanations.

<Coating and Developing System>

Figure 1:
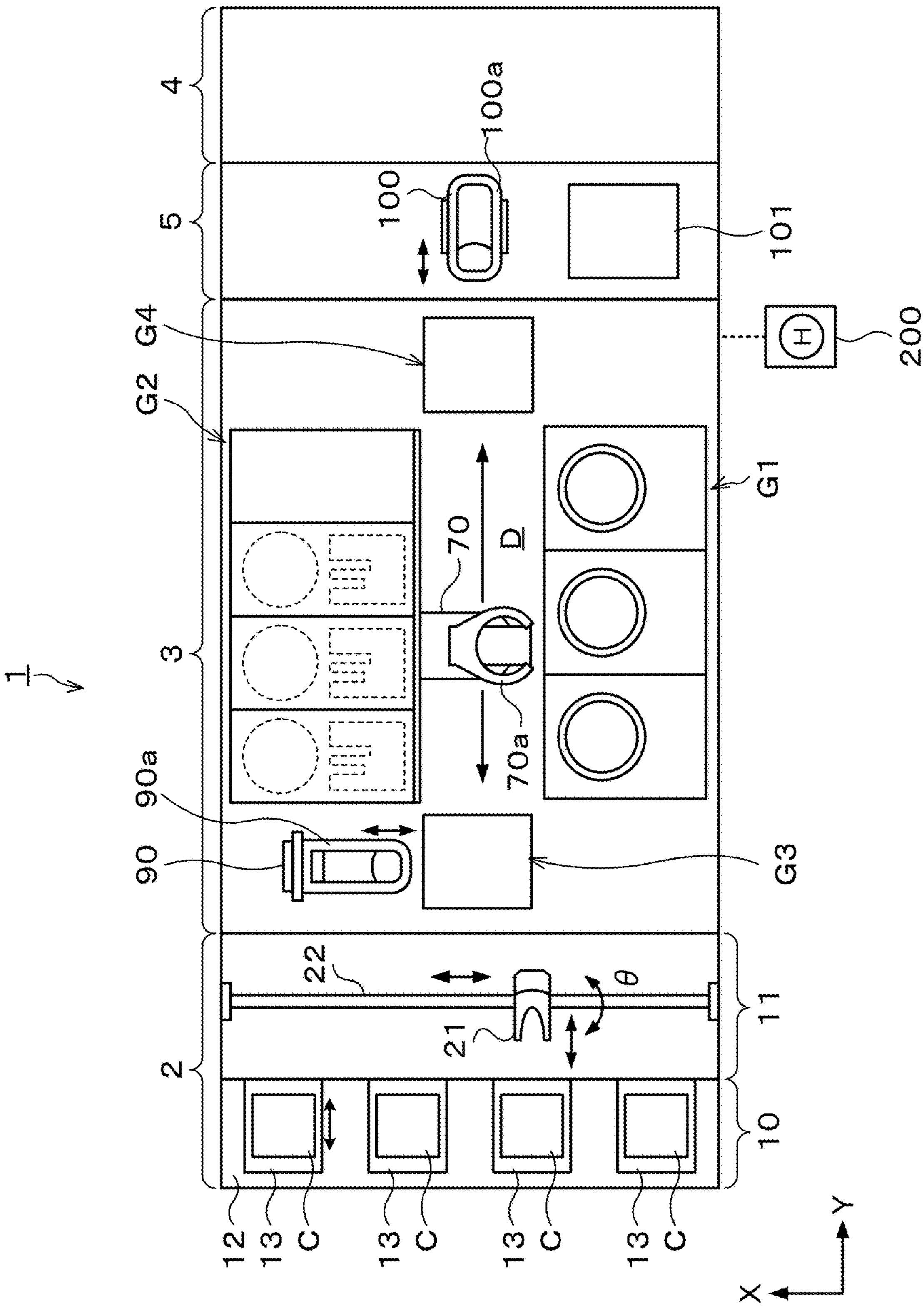
FIG. 1 is an explanatory view illustrating the outline of an internal configuration of a coating and developing system as a substrate treatment system including a thermal treatment apparatus according to this embodiment.
Figure 2:
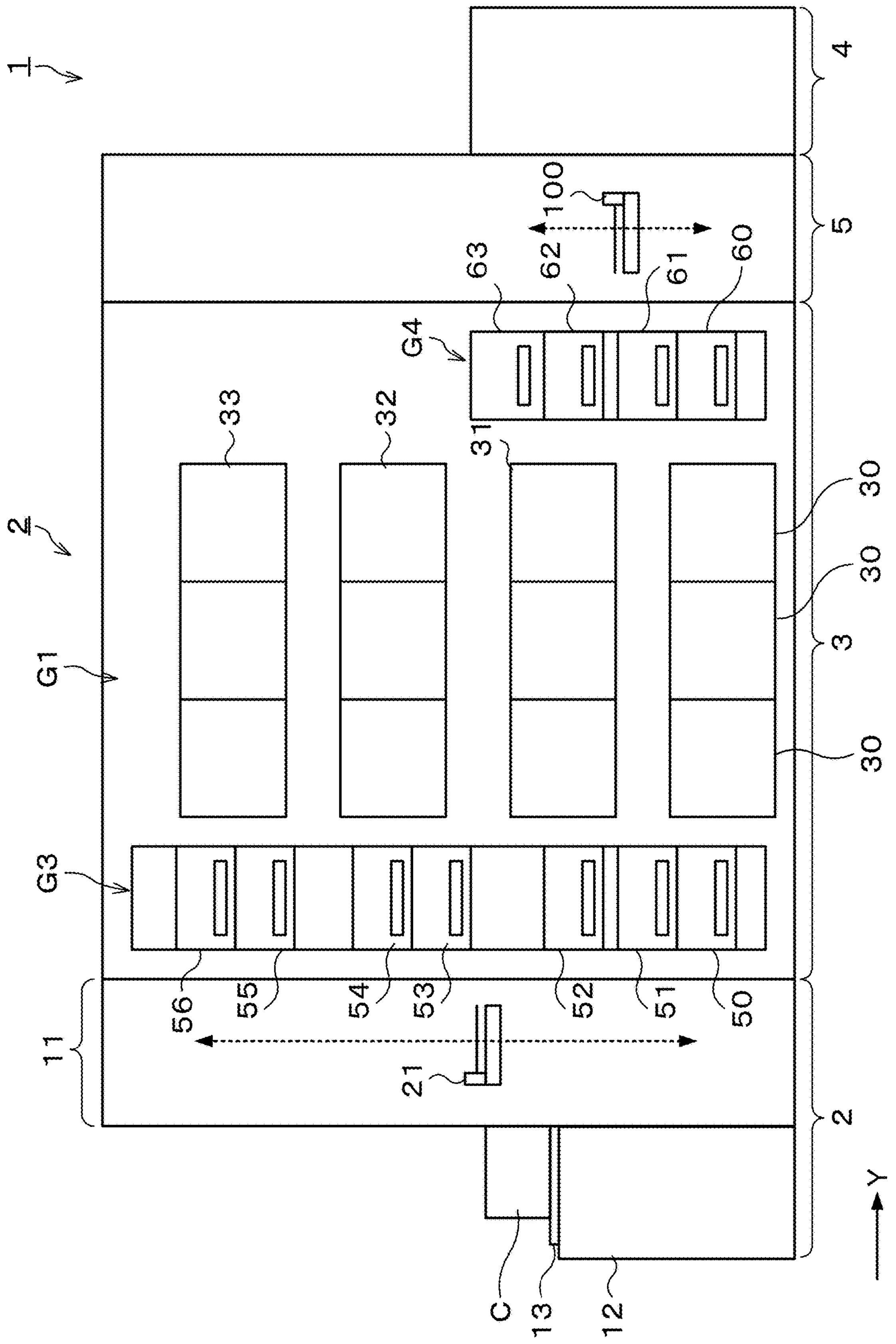
FIG. 2 is a view illustrating the outline of the internal configuration on a front side of the coating and developing system.
Figure 3:
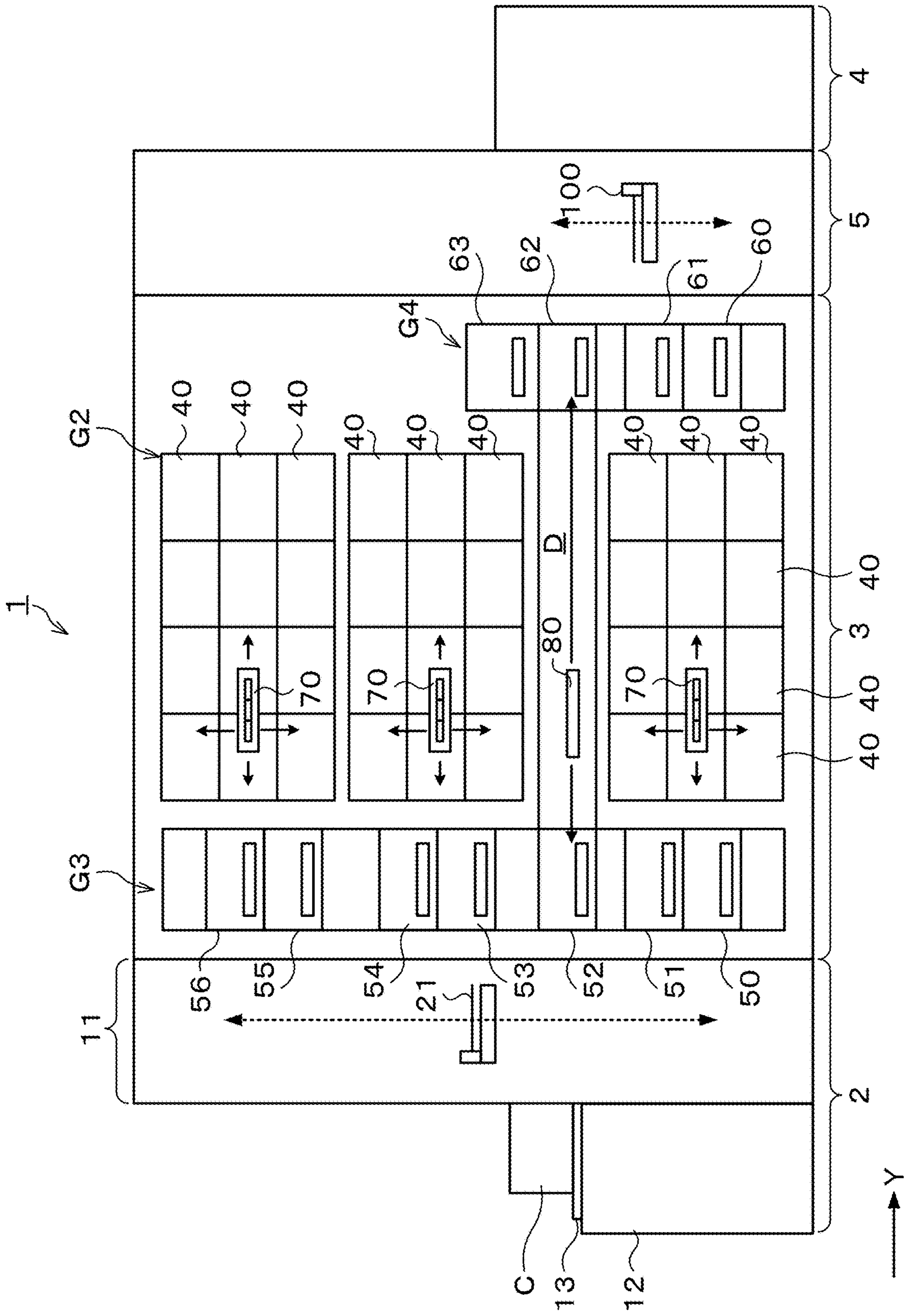
FIG. 3 is a view illustrating the outline of the internal configuration on a rear side of the coating and developing system.

FIG. 1 is an explanatory view illustrating the outline of an internal configuration of a coating and developing system as a substrate treatment system including a thermal treatment apparatus according to this embodiment. FIG. 2 and FIG. 3 are views illustrating the outline of the internal configuration on a front side and a rear side of the coating and developing system, respectively.

The coating and developing system 1 forms a resist pattern on the wafer W as the substrate using the resist. The resist to be used is such a resist that produces a sublimate and is, for example, a metal-containing resist. Note that though any metal may be contained in the metal-containing resist, the metal is, for example, tin.

The coating and developing system 1 has, as illustrated in FIG. 1 to FIG. 3, a cassette station 2 into/out of which a cassette C being a container capable of housing a plurality of wafers is transferred, and a treatment station 3 including a plurality of various treatment apparatuses which perform predetermined treatments such as the resist coating treatment and so on. The coating and developing system 1 further has a configuration in which the cassette station 2, the treatment station 3, and an interface station 5 which performs delivery of the wafer W to/from an exposure apparatus 4 adjacent to the treatment station 3 are integrally connected.

The cassette station 2 is divided, for example, into a cassette transfer-in/out section 10 and a wafer transfer section 11. The cassette transfer-in/out section 10 is provided, for example, at an end on a Y-direction negative direction (left direction in FIG. 1) side in the substrate treatment system 1. In the cassette transfer-in/out section 10, a cassette stage 12 is provided. On the cassette stage 12, a plurality of, for example, four stage plates 13 are provided. The stage plates 13 are provided side by side in a row in an X-direction being a horizontal direction (an up-down direction in FIG. 1). On the stage plates 13, cassettes C can be mounted when the cassettes C are transferred in/out from/to the outside of the coating and developing system 1.

In the wafer transfer section 11, a transfer apparatus 20 is provided which transfers the wafer W. The transfer apparatus 20 is configured to be movable in a transfer path 21 extending in the X-direction. The transfer apparatus 20 is movable also in the up-down direction and around a vertical axis (in a θ-direction), and can transfer the wafer W between the cassette C on each of the stage plates 13 and a later-explained delivery apparatus in a third block G3 in the treatment station 3.

In the treatment station 3, a plurality of, for example, first to fourth four blocks G1, G2, G3, G4 each including various apparatuses are provided. For example, the first block G1 is provided on the front side (an X-direction negative direction side in FIG. 1) in the treatment station 3, and the second block G2 is provided on the rear side (an X-direction positive direction side in FIG. 1) in the treatment station 3. Further, the third block G3 is provided on the cassette station 2 side (a Y-direction negative direction side in FIG. 1) in the treatment station 3, and the fourth block G4 is provided on the interface station 5 side (a Y-direction positive direction side in FIG. 1) in the treatment station 3.

In the first block G1, as illustrated in FIG. 2, a plurality of solution treatment apparatuses, for example, a developing treatment apparatus 30, a lower anti-reflection film forming apparatus 31, a resist coating apparatus 32, and an upper anti-reflection film forming apparatus 33 are arranged in this order from the bottom. The developing treatment apparatus 30 performs a developing treatment on the wafer W. Specifically, the developing treatment apparatus 30 performs a developing treatment on a metal-containing resist film of the wafer W subjected to the PEB treatment. The lower anti-reflection film forming apparatus 31 forms an anti-reflection film (hereinafter, referred to as a "lower anti-reflection film") at a lower layer of the metal-containing resist film of the wafer W. The resist coating apparatus 32 applies a metal-containing resist to the wafer W to form a coating film of the metal-containing resist, namely, a metal-containing resist film. The upper anti-reflection film forming apparatus 33 forms an anti-reflection film (hereinafter, referred to as an "upper anti-reflection film") at an upper layer of the metal-containing resist film of the wafer W.

For example, the developing treatment apparatus 30, the lower anti-reflection film forming apparatus 31, the resist coating apparatus 32, and the upper anti-reflection film forming apparatus 33 are arranged three each side by side in the horizontal direction. Note that the numbers and the arrangement of the developing treatment apparatuses 30, the lower anti-reflection film forming apparatuses 31, the resist coating apparatuses 32, and the upper anti-reflection film forming apparatuses 33 can be arbitrarily selected.

In each of the developing treatment apparatus 30, the lower anti-reflection film forming apparatus 31, the resist coating apparatus 32, and the upper anti-reflection film forming apparatus 33, a predetermined treatment solution is applied onto the wafer W, for example, by the spin coating method. In the spin coating method, the treatment solution is discharged onto the wafer W, for example, from a discharge nozzle and the wafer W is rotated to diffuse the treatment solution over the front surface of the wafer W.

For example, in the second block G2, as illustrated in FIG. 3, thermal treatment apparatuses 40 each of which performs a thermal treatment on the wafer W are lined up in the up-down direction and the horizontal direction. The number and the arrangement of the thermal treatment apparatuses 40 can also be arbitrarily selected. Note that in the thermal treatment apparatuses 40, a pre-baking treatment (hereinafter, referred to as a "PAB treatment") of heat-treating the wafer W after the resist coating treatment, the PEB treatment of heat-treating the wafer W after the exposure treatment, a post-baking treatment (hereinafter, referred to as a "POST treatment") of heat-treating the wafer W after the developing treatment, and so on are performed.

In the third block G3, for example, a plurality of delivery apparatuses 50, 51, 52, 53, 54, 55, 56 are provided in order from the bottom. Further, in the fourth block G4, a plurality of delivery apparatuses 60, 61, 62 and a rear surface cleaning apparatus 63 for cleaning the rear surface of the wafer W are provided in order from the bottom.

A wafer transfer region D is formed in a region surrounded by the first block G1 to the fourth block G4 as illustrated in FIG. 1. In the wafer transfer region D, for example, a transfer apparatus 70 as a substrate transfer apparatus for transferring the wafer W is arranged.

The transfer apparatus 70 has a transfer arm 70a movable, for example, in the Y-direction, the θ-direction, and the up-down direction. The transfer apparatus 70 can move the transfer arm 70a holding the wafer W in the wafer transfer region D to transfer the wafer W to a predetermined apparatus in the first block G1, the second block G2, the third block G3, and the fourth block G4 located therearound. A plurality of the transfer apparatuses 70 are arranged one above the other, for example, as illustrated in FIG. 3, and each of the transfer apparatuses 70 can transfer the wafer W, for example, to a predetermined apparatus at a similar height in each of the blocks G1 to G4.

Further, in the wafer transfer region D, a shuttle transfer apparatus 80 is provided which linearly transfers the wafer W between the third block G3 and the fourth block G4.

The shuttle transfer apparatus 80 can linearly move the supported wafer W in the Y-direction and transfer the wafer W between the delivery apparatus 52 in the third block G3 and the delivery apparatus 62 in the fourth block G4 at a similar height.

As illustrated in FIG. 1, a transfer apparatus 90 is provided on the X-direction positive direction side of the third block G3. The transfer apparatus 90 has a transfer arm 90a movable, for example, in the θ-direction and the up-down direction. The transfer apparatus 90 can move up and down the transfer arm 90a holding the wafer W to transfer the wafer W to each of the delivery apparatuses in the third block 3.

In the interface station 5, a transfer apparatus 100 and a delivery apparatus 101 are provided. The transfer apparatus 100 has a transfer arm 100a movable, for example, in the θ-direction and the up-down direction. The transfer apparatus 100 can transfer the wafer W to/from each of the delivery apparatuses in the fourth block G4, the delivery apparatus 101, and the exposure apparatus 4 while holding the wafer W by the transfer arm 100a.

In the above coating and developing system 1, a controller 200 is provided as illustrated in FIG. 1. The controller 200 is a computer including, for example, a processor such as a CPU, a memory and so on, and has a program storage (not illustrated). In the program storage, a program for controlling a later-explained wafer treatment by controlling the operations of drive systems of the above various treatment apparatuses and various transfer apparatuses is stored. Note that the above program may be the one recorded in a non-transitory computer-readable storage medium H and installed from the storage medium H into the controller 200. The storage medium H may be a transitory one or a non-transitory one. Part or all of the program may be realized by dedicated hardware (circuit board).

<Wafer Treatment Using the Coating and Developing System 1>

Next, one example of the wafer treatment using the coating and developing system 1 will be explained. Note that the following treatment is performed under control of the controller 200.

First, the cassette C housing a plurality of wafers W is transferred into the cassette station 2 of the coating and developing system 1 and mounted on the stage plate 13. Then, the wafers W in the cassette C are successively taken out by the transfer apparatus 20 and transferred to the delivery apparatus 53 in the third block G3 in the treatment station 3.

Next, the wafer W is transferred by the transfer apparatus 70 to the thermal treatment apparatus 40 in the second block G2, and subjected to a temperature regulation treatment. The wafer W is then transferred by the transfer apparatus 70, for example, to the lower anti-reflection film forming apparatus 31 in the first block G1, in which a lower anti-reflection film is formed on the wafer W. The wafer W is then transferred to the thermal treatment apparatus 40 in the second block G2, and subjected to a heat treatment. The wafer W is then returned to the delivery apparatus 53 in the third block G3.

Next, the wafer W is transferred by the transfer apparatus 70 to the resist coating apparatus 32, in which a metal-containing resist film is formed on the wafer W. Thereafter, the wafer W is transferred by the transfer apparatus 70 to the thermal treatment apparatus 40 and subjected to a PAB treatment. The wafer W is then transferred by the transfer apparatus 70 to the delivery apparatus 55 in the same third block G3.

Next, the wafer W is transferred by the transfer apparatus 70 to the upper anti-reflection film forming apparatus 33, in which an upper anti-reflection film is formed on the wafer W. The wafer W is then transferred by the transfer apparatus 70 to the thermal treatment apparatus 40 and heated and temperature-regulated.

Thereafter, the wafer W is transferred by the transfer apparatus 70 to the delivery apparatus 56 in the third block G3.

Next, the wafer W is transferred by the transfer apparatus 90 to the delivery apparatus 52 and transferred by the shuttle transfer apparatus 80 to the delivery apparatus 62 in the fourth block G4. The wafer W is then transferred by the transfer apparatus 100 to the rear surface cleaning apparatus 63 and subjected to rear surface cleaning. The wafer W is then transferred by the transfer apparatus 100 in the interface station 5 to the exposure apparatus 4 and subjected to an exposure treatment in a predetermined pattern using EUV light.

Next, the wafer W is transferred by the transfer apparatus 100 to the delivery apparatus 60 in the fourth block G4. The wafer W is then transferred to the thermal treatment apparatus 40 and subjected to a PEB treatment.

Next, the wafer W is transferred by the transfer apparatus 70 to the developing treatment apparatus 30 and developed. After finish of the development, the wafer W is transferred by the transfer apparatus 90 to the thermal treatment apparatus 40 and subjected to a POST treatment.

The wafer W is then transferred by the transfer apparatus 70 to the delivery apparatus 50 in the third block G3, and then transferred by the transfer apparatus 20 in the cassette station 2 to the cassette C on the predetermined cassette stage plate 13, with which a series of the photography process is completed.

<Thermal Treatment Apparatus>

Figure 4:
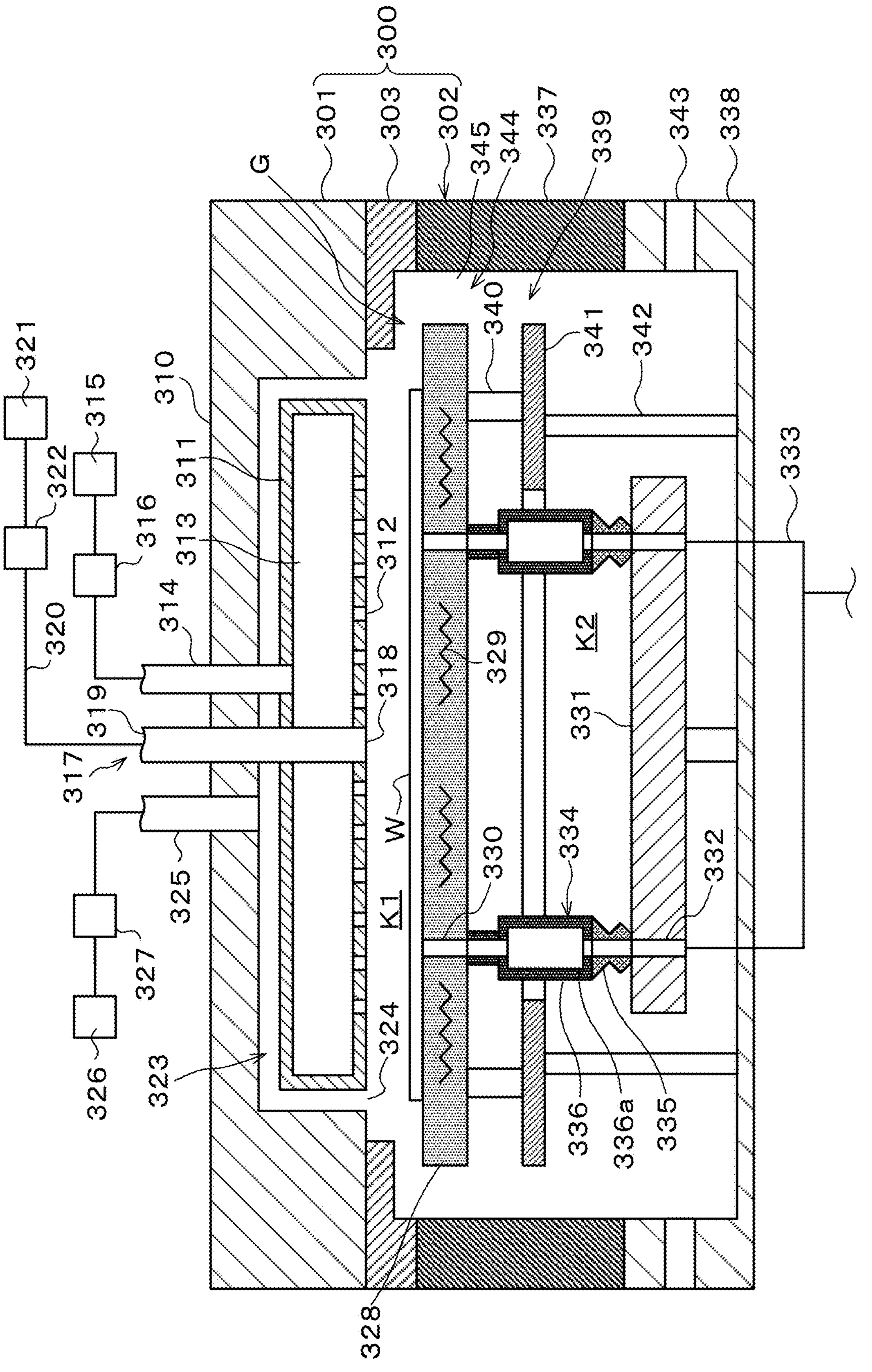
FIG. 4 is a longitudinal sectional view schematically illustrating the outline of a configuration of the thermal treatment apparatuses used for a PEB treatment.
Figure 5:
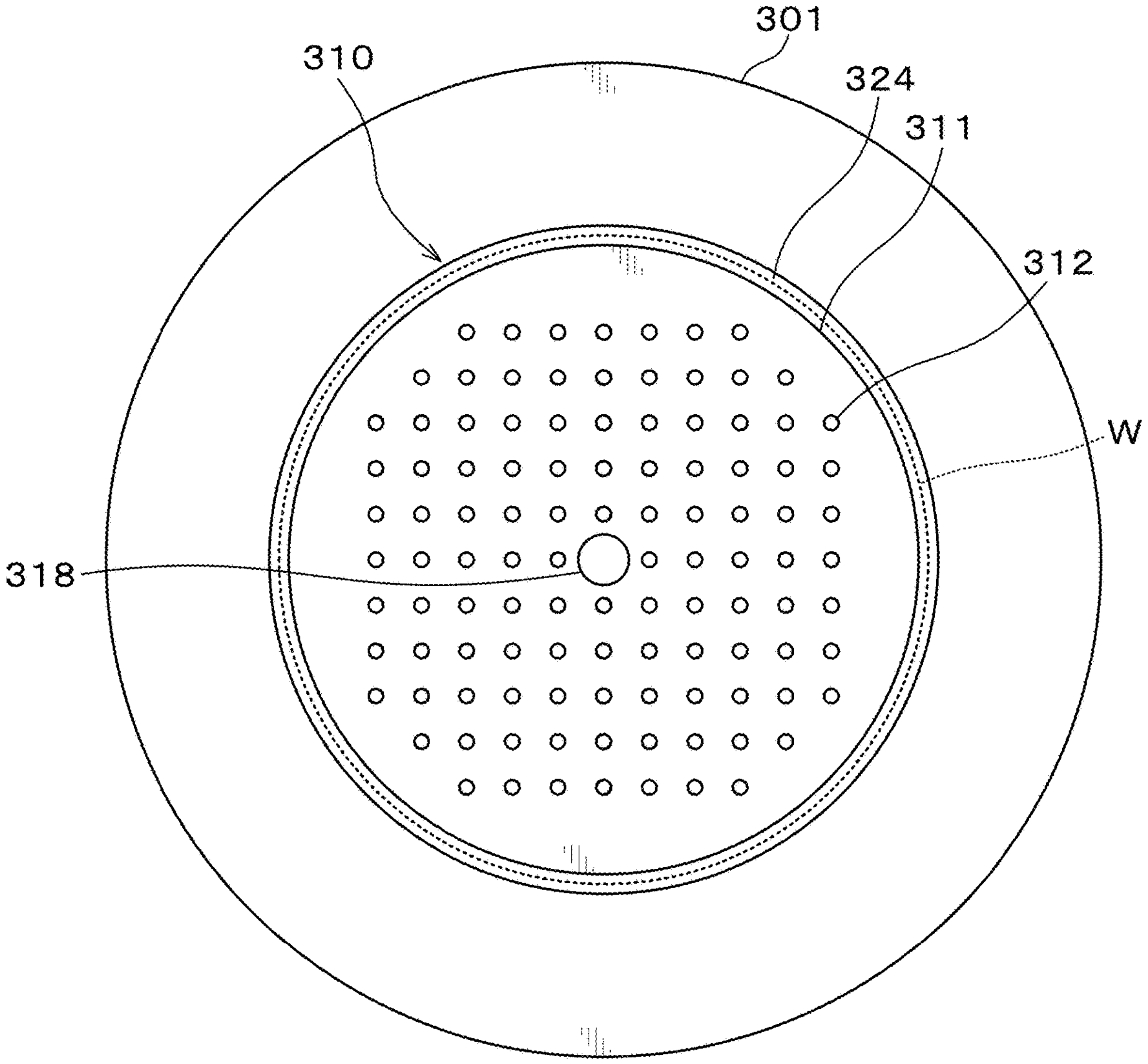
FIG. 5 is a bottom view schematically illustrating the outline of a configuration of an upper chamber.

Next, the thermal treatment apparatus 40 used for the PEB treatment of the thermal treatment apparatuses 40 will be explained. FIG. 4 is a longitudinal sectional view schematically illustrating the outline of a configuration of the thermal treatment apparatuses 40 used for the PEB treatment. FIG. 5 is a bottom view schematically illustrating the outline of a configuration of a later-explained upper chamber 301.

The thermal treatment apparatus 40 in FIG. 4 includes a chamber 300. The chamber 300 includes an upper chamber 301, a lower chamber 302, and a straightening member 303. The upper chamber 301 is located on the upper side, and the lower chamber 302 is located on the lower side. The straightening member 303 is located between the upper chamber 301 and the lower chamber 302 and, more specifically, located between a peripheral edge portion of the upper chamber 301 and a peripheral edge portion of the lower chamber 302.

The upper chamber 301 is configured to be freely raised and lowered. A raising and lowering mechanism (not illustrated) having a driving source such as a motor which raises and lowers the upper chamber 301 is controlled by the controller 200.

Further, the upper chamber 301 is formed, for example, in a disk shape. The upper chamber 301 has a ceiling 310. The ceiling 310 forms thereunder a treatment space K1 in which the thermal treatment is performed, and is provided in a manner to face the wafer W on a hot plate 328. Further, the ceiling 310 is provided with a shower head 311 as a gas discharger.

The shower head 311 discharges a treatment gas toward the wafer W on the hot plate 328 from above. The treatment gas is, for example, gas containing moisture, namely, a moisture-containing gas.

The shower head 311 has a plurality of discharge holes 312 and a gas distribution space 313.

Each of the discharge holes 312 is formed in a lower surface of the shower head 311. The discharge holes 312 are arranged almost uniformly at a portion other than a later-explained exhaust hole, on the lower surface of the shower head 311 as illustrated in, for example, FIG. 5. The plurality of discharge holes 312 include a first discharge hole located above a peripheral edge portion of the wafer W on the hot plate 328, and a second discharge hole located above a central portion of the wafer W on the hot plate 328.

In the gas distribution space 313, the treatment gas supplied to the gas distribution space 313 is distributed and supplied to the discharge holes 312. As illustrated in FIG. 4, a treatment gas source 315 which stores the treatment gas is connected to the shower head 311 via a gas supply pipe 314. The gas supply pipe 314 is provided with a supply equipment group 316 including a valve and a flow rate regulating vale and so on which control the flow of the treatment gas.

Further, the ceiling 310 of the upper chamber 301 is provided with a central exhauster 317. The central exhauster 317 exhausts the treatment space K1 above the hot plate 328 in the chamber 300 from a position close to the center in top view of the wafer W on the hot plate 328 (from the central position in the example of the drawing) on the ceiling 310. The central exhauster 317 has an exhaust hole 318. The exhaust hole 318 is provided at the position (the central position in the example of the drawing) close to the center in top view of the wafer W on the hot plate 328 on the lower surface of the shower head 311 as illustrated in FIG. 5, and opens downward. The central exhauster 317 exhausts the treatment space K1 via the exhaust hole 318.

Further, though not illustrated, a plurality of the exhaust holes 318 may be provided in a manner to surround a position directly above the center of the wafer W. In this case, the plurality of exhaust holes 318 are provided, for example, at positions in a region within one-third of the wafer radius from the center of the wafer W in top view so as not to impair the action of exhaust by the later-explained central exhauster 317.

As illustrated in FIG. 4, the central exhauster 317 has a central exhaust path 319 formed in a manner to extend upward from the exhaust hole 318. To the central exhaust path 319, an exhaust apparatus 321 such as a vacuum pump is connected via an exhaust pipe 320. The exhaust pipe 320 is provided with an exhaust equipment group 322 having a valve and so on which regulate the exhaust rate.

Further, the ceiling 310 of the upper chamber 301 is provided with a peripheral exhauster 323. The peripheral exhauster 323 exhausts the treatment space K1 from a side closer to the peripheral edge portion of the wafer W on the hot plate 328 than the central exhauster 317 in top view on the ceiling 310. The peripheral exhauster 323 has an exhaust port 324. The exhaust port 324 opens downward from the lower surface of the ceiling 310 in a manner to surround the outer periphery of the shower head 311 as illustrated in FIG. 5. The exhaust port 324 may be composed of a plurality of exhaust holes arranged along the outer periphery of the shower head 311. The peripheral exhauster 323 exhausts the treatment space K1 via the exhaust port 324.

The exhaust port 324 is provided between a position where a peripheral edge of the exhaust port 324 overlaps with a peripheral edge of the wafer W on the hot plate 328 in top view and a position 10 mm inside of the former position.

The peripheral exhauster 323 in FIG. 4 has a peripheral exhaust path extending from the exhaust port 324. To the peripheral exhaust path, an exhaust apparatus 326 such as a vacuum pump is connected via an exhaust pipe 325. The exhaust pipe 325 is provided with an exhaust equipment group 327 having a valve and so on which regulate the exhaust rate.

Further, the upper chamber 301 is configured to be capable of heating the upper chamber 301. For example, the upper chamber 301 has a built-in heater (not illustrated) which heats the upper chamber 301. The heater is controlled by the controller 200, whereby the upper chamber 301 (specifically, for example, the shower head 311) is regulated to a predetermined temperature.

The lower chamber 302 is provided in a manner to surround the hot plate 328 which supports and heats the wafer W.

The hot plate 328 has a thick disk shape. Further, the hot plate 328 has, for example, a heater 329 built therein. Thus, the hot plate 328 is controlled in temperature, for example, by the controller 200 to heat the wafer W mounted on the hot plate 328 to a predetermined temperature.

Further, the hot plate 328 has a plurality of suction holes 330 for sucking the wafer W to the hot plate 328. Each of the suction holes 330 is formed to penetrate the hot plate 328 in the thickness direction.

Further, each of the suction holes 330 is connected to a relay hole 332 of a relay member 331. Each relay hole 332 is connected to an exhaust line 333 which performs exhaust for suction.

The connection between the suction hole 330 and the relay hole 332 is performed via a metal member 334 made of metal and a pad 335 made of resin. Specifically, the connection between the suction hole 330 and the relay hole 332 is performed via a flow path in the metal member 334 and a flow path in the resinous pad 335.

The metal member 334 is located on the suction hole 330 side and the resinous pad 335 is located on the relay hole 332 side. The metal member 334 has one end directly connected to the hot plate 328 (specifically, the suction hole 330) and another end directly connected to one end of the corresponding resinous pad 335. In other words, each resinous pad 335 communicates with the corresponding suction hole 330 and is connected to the hot plate 328 via the metal member 334. Further, another end of the resinous pad 335 is directly connected to the relay member 331 (specifically, the relay hole 332).

The metal member 334 has a large-diameter part 336 on the resinous pad 335 side. The inside of the large-diameter part 336 has a flow path space 336*a* larger in cross-sectional area than a portion of the metal member 334 which is connected to the hot plate 328, and is thus reduced in risk of clogging with a sublimate produced by the thermal treatment. Further, owing to the flow path space 336*a* having a large cross-sectional area, the gas sucked from the treatment space K1 at suction of the wafer W is mitigated in heat and flows toward the exhaust line 333 for suction. In other words, it is possible to suppress a deterioration risk due to high temperature of the resinous pad 335 and devices constituting an exhaust flow path down to the exhaust line 333.

Further, in the lower chamber 302, for example, three raising and lowering pins (not illustrated) which support the wafer W from below and raise and lower the wafer W are provided below the hot plate 328. The raising and lowering pins are raised and lowered by a raising and lowering mechanism (not illustrated) having a driving source such as a motor. The raising and lowering mechanism is controlled by the controller 200. Note that at the central portion of the hot plate 328, through holes (not illustrated) are formed through which the raising and lowering pins pass. The raising and lowering pins can pass through the through holes and project from the upper surface of the hot plate.

Further, the lower chamber 302 has a support ring 337 and a bottom chamber 338.

The support ring 337 has a cylindrical shape. For the material of the support ring 337, for example, metal such as stainless steel is used. The support ring 337 covers an outer surface of the hot plate 328. The support ring 337 is fixed to a top of the bottom chamber 338.

The bottom chamber 338 has a bottomed cylindrical shape.

The above hot plate 328 is supported, for example, on a bottom wall of the bottom chamber 338. Specifically, the hot plate 328 is supported on the bottom wall of the bottom chamber 338 via a support 339. The support 339 has, for example, a supporting post 340 which has an upper end connected to the hot plate 328, an annular member 341 which supports the supporting post 340, and a leg member 342 which supports the annular member 341 on the bottom wall of the bottom chamber 338.

The annular member 341 is formed of metal, and is provided has a gap corresponding to a height of the supporting post 340 with respect to the most of the rear surface of the hot plate 328. The resinous pad 335 is located below the annular member 341 provided as explained above, whereby the annular member 341 effectively blocks the heat from the hot plate 328 to prevent the resinous pad 335 from being exposed to high temperature (from being thermally deteriorated).

Further, the lower chamber 302 has an intake port 343. The intake port 343 takes gas into the chamber 300 from the outside of the chamber 300. The intake port 343 is formed, for example, in a cylindrical side wall of the bottom chamber 338.

Note that an inner peripheral surface of the side wall of the bottom chamber 338 and an inner peripheral surface of the support ring 337 have, for example, the same diameter.

Further, the chamber 300 has a gas supplier 344. The gas supplier 344 supplies gas toward the wafer W on the hot plate 328 from below the front surface (namely, the top surface) of the wafer W on the hot plate 328.

The gas supplier 344 includes a gas flow path 345 provided in a manner to surround the side surface of the hot plate 328, and the straightening member 303.

The gas flow path 345 is composed of, for example, a space between the outer surface of the hot plate 328 and the inner peripheral surface of the support ring 337. Accordingly, the gas flow path 345 is formed, for example, in an annular shape in plan view. Note that the outer surface of the hot plate 328 may be supported by the inner peripheral surface of the side wall of the lower chamber 302 via a support member, a plurality of through holes penetrating in the up-down direction may be provided in an annular form in the support member, and the plurality of through holes may be used as the gas flow path 345.

The straightening member 303 is a member which causes the gas rising along the gas flow path 345 to go toward the wafer W on the hot plate 328.

The straightening member 303 is formed, for example, in an annular shape in plan view.

An inner peripheral side lower surface of the straightening member 303 is a guide surface which causes the gas rising along the gas flow path 345 to go to the center of the hot plate 328. An inner peripheral side end of the lower surface of the straightening member 303 is located at a height of the treatment space K1, namely, a height equal to or less than one-half a height from the front surface of the hot plate 328 on which the wafer W is mounted to the lower surface of the shower head 311 formed with the discharge holes 312 and facing the wafer W on the hot plate 328. For example, the inner peripheral side end of the lower surface of the straightening member 303 is located below the front surface of the wafer W on the hot plate 328.

An inner peripheral side portion of the straightening member 303 overlaps with the peripheral edge portion of the hot plate 328 in top view. but does not overlap with the wafer W on the hot plate 328 in top view. The gas rising along the gas flow path 345 passes through a gap G between the inner peripheral side lower surface of the straightening member 303 and the upper surface of the peripheral edge portion of the hot plate 328, and goes toward the wafer W from the lateral side of the wafer W on the hot plate 328 in the treatment space K1. Assuming that a space above the front surface of the hot plate 328 is the treatment space K1, the gap G through which the gas flows into the treatment space K1 is provided at a lower portion of the treatment space K1.

The gap G is connected to one end of the gas flow path 345. Further, another end of the gas flow path 345 is connected to a buffer space K2 below the hot plate 328 in the chamber 300. The buffer space K2 below the hot plate 328 is larger in volume than the treatment space above the hot plate 328.

The inner peripheral surface of the straightening member 303 linearly extends downward from the ceiling 310 of the upper chamber 301.

In one embodiment, the straightening member 303 is a solid body. For the material of the straightening member 303, for example, a metal material such as stainless steel is used.

Further, the entire upper surface of the straightening member 303 is in contact with the lower surface of the upper chamber 301.

More specifically, the straightening member 303 is fixed to the upper chamber 301 in a form where the entire upper surface of the straightening member 303 is in contact with the lower surface of the upper chamber 301, and is raised and lowered together with the upper chamber 301.

The straightening member 303 is lowered together with the upper chamber 301 to come into contact with the lower chamber 302 (specifically, the support ring 337), whereby the chamber 300 is closed. To suppress the production of dust due to the contact between the metallic straightening member 303 and the metallic support ring 337, the following may be implemented. Specifically, a resinous projection may be provided on a surface of the support ring 337 facing the straightening member 303 so that the straightening member 303 when lowered comes into contact with the resinous projection. Alternatively, a resinous projection may be provided on a surface of the straightening member 303 facing the support ring 337 so that when the straightening member 303 is lowered, the resinous projection and the support ring 337 come into contact. In these cases, it is preferable that the height of the resinous projection is as small as possible. This is for making the gap between the lower surface of the straightening member 303 and the upper surface of the support ring 337 small to prevent a sublimate or the like from entering the gap. The height of the resinous projection is at least a height at which the gap between the lower surface of the straightening member 303 and the upper surface of the support ring 337 is smaller than the shortest distance from the straightening member 303 to the wafer W on the hot plate 328.

Note that the thermal treatment apparatus 40 may further include a cooling plate (not illustrated) having a function of cooling the wafer W. The cooling plate moves back and forth between a cooling position outside the chamber 300 and a delivery position at least a part of which is arranged inside the chamber 300 and at which the wafer W is delivered between the cooling plate and the hot plate 328. Alternatively, the cooling plate may be fixed at a position aligned with the hot plate 328 in the horizontal direction, and the thermal treatment apparatus 40 may have a transfer arm which transfers the wafer W between the cooling plate and the hot plate 328.

<Wafer Treatment Using the Thermal Treatment Apparatus 40>

Figure 6:
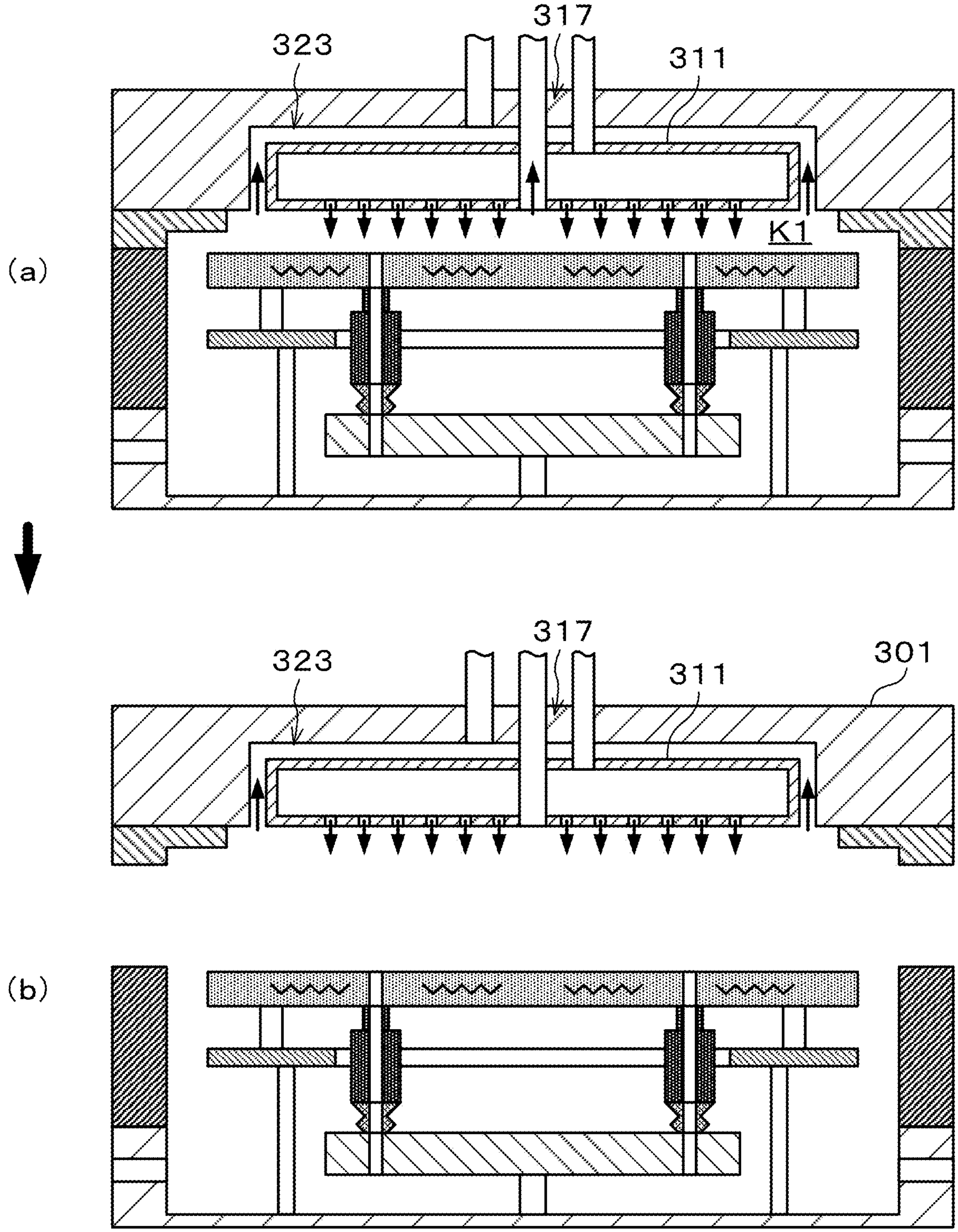
FIG. 6 is a view illustrating a state of the thermal treatment apparatus during a wafer treatment performed using the thermal treatment apparatus.
Figure 7:
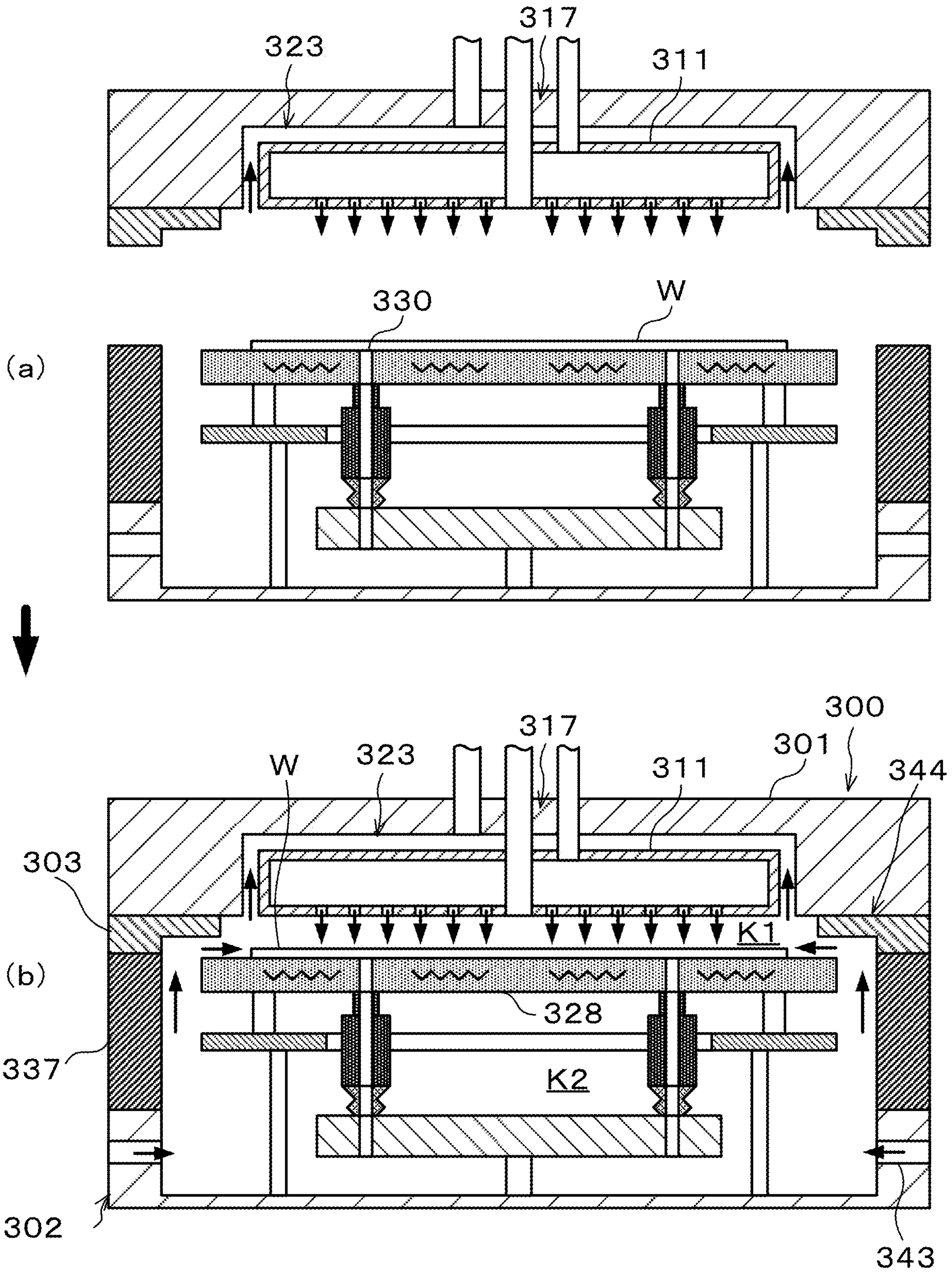
FIG. 7 is a view illustrating the state of the thermal treatment apparatus during the wafer treatment performed using the thermal treatment apparatus.
Figure 8:
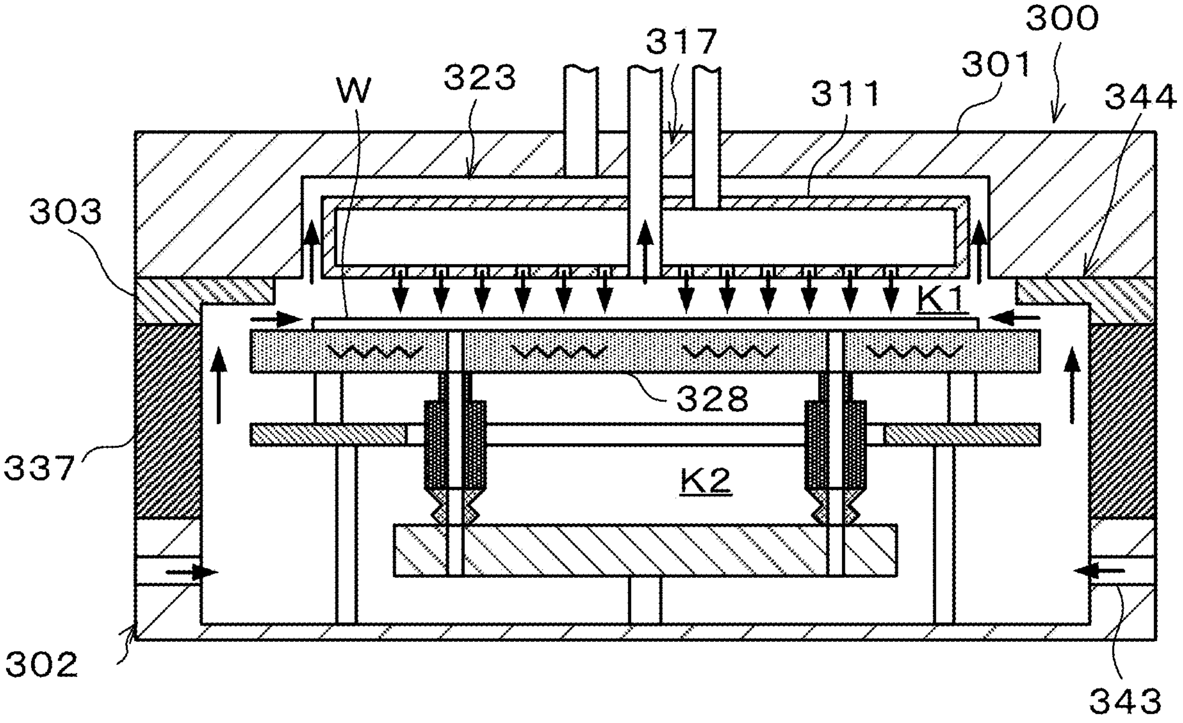
FIG. 8 is a view illustrating the state of the thermal treatment apparatus during the wafer treatment performed using the thermal treatment apparatus.

Next, one example of the wafer treatment performed using the thermal treatment apparatus 40 will be explained using FIG. 6 to FIG. 8. FIG. 6 to FIG. 8. are views illustrating the state of the thermal treatment apparatus 40 during the wafer treatment performed using the thermal treatment apparatus 40. Note that the following wafer treatment is performed under control of the controller 200.

(Step S1: Adjusting the State in the Chamber)

First, for example, the state in the chamber 300 is adjusted prior to the mounting of the wafer W on the hot plate 328.

Specifically, the hot plate 328 is regulated to a predetermined temperature.

Further, the humidity in the treatment space K1 is regulated. The regulation of the humidity in the treatment space K1 is performed by the exhaust by the central exhauster 317, the exhaust by the peripheral exhauster 323, and the discharge of the treatment gas from the shower head 311 as illustrated in FIG. 6(*a*).

(Step S2: Wafer Mounting)

Next, the wafer W on which the coating film of the metal-containing resist has been formed is mounted on the hot plate 328.

Specifically, as illustrated in FIG. 6(*b*), only the exhaust by the central exhauster 317 is stopped while the exhaust by the peripheral exhauster 323 and the discharge of the treatment gas from the shower head 311 are continued, and the upper chamber 301 is raised. The wafer W is thereafter transferred by the transfer apparatus 70 to above the hot plate 328. Then, the raising and lowering of the raising and lowering pins is performed, the wafer W is delivered from the transfer apparatus 70 to the raising and lowering pins, and the wafer W is delivered from the raising and lowering pins to the hot plate 328, whereby the wafer W is mounted on the hot plate 328 as illustrated in FIG. 7(*a*). Thereafter, the wafer W is sucked to the hot plate 328 via the suction holes 330.

(Step S3: PEB Treatment)

Subsequently, the wafer W on the hot plate 328 is subjected to the PEB treatment.

(Step S3*a*: Start of the PEB Treatment)

Specifically, as illustrated in FIG. 7(*b*), the upper chamber 301 is lowered, whereby the straightening member 303 comes into contact with the support ring 337 of the lower chamber 302 to bring the chamber 300 into a closed state. This starts the PEB treatment on the wafer W on the hot plate 328.

Until a first predetermined time elapses from the start of the PEB treatment, the exhaust by the central exhauster 317 is not performed, but the discharge of the gas from the shower head 311 and the exhaust by the peripheral exhauster 323 are performed. Further, the discharge of the treatment gas from the shower head 311 and the exhaust by the peripheral exhauster 323 are performed such that the gas supply by the gas supplier 344 is performed. For example, a control is conducted such that an exhaust flow rate L2 from the treatment space K1 by the peripheral exhauster 323 is higher than a discharge flow rate L1 from the shower head 311 to the treatment space K1. Thus, gas corresponding to a flow rate (L2-L1) is taken into the chamber 300 from the outside of the chamber 300 via the intake port 343. Then, the gas corresponding to the flow rate (L2-L1) is supplied from the gas supplier 344 toward the wafer W on the hot plate 328. The flow rate of the gas to be supplied from the gas supplier 344 toward the wafer W on the hot plate 328 is substantially even over the circumferential direction. The intake port 343 can be said to be an introduction portion for gas made to flow into the treatment space K1 at a position below the hot plate 328.

In the case of performing only the exhaust by the peripheral exhauster 323, a flow of the treatment gas moving in the radial direction to the peripheral edge portion of the wafer W is formed along the front surface of the wafer W near the front surface of the wafer W.

In contrast to the above, in the case accompanying the exhaust by the central exhauster 317, the treatment gas does not flow along the front surface of the wafer W but flows to rise as going from the peripheral edge toward the center on the wafer W. Therefore, the gap between a boundary layer of a gas flow of the treatment gas toward the central exhauster 317 and the front surface of the wafer W differs within the wafer W. This causes unevenness in volatilization amount from the coating film on the wafer W. This unevenness in volatilization amount then adversely affects the in-plane uniformity of the film thickness on the wafer W when the solidification does not proceed at the initial stage of the PEB treatment and the volatilization amount is large.

Hence, the exhaust by the central exhauster 317 is not performed but the discharge of the gas from the shower head 311 and the exhaust by the peripheral exhauster 323 are performed until the first predetermined time elapses from the start of the PEB treatment as explained above. The first predetermined time is set so that the coating film of the metal-containing resist on the wafer W is solidified to a desired level. In other words, the first predetermined time is set so that the dehydration condensation of the metal-containing resist on the wafer W proceeds to a desired level.

Further, since the discharge of the treatment gas from the shower head 311 and the exhaust by the peripheral exhauster 323 are performed so that the gas supply by the gas supplier 344 is performed, the gas supplied from the gas supplier 344 toward the wafer W moves to the exhaust port 324 to form a rising flow around the wafer W. In this event, the treatment gas possibly containing a sublimate discharged from the shower head 311 toward the wafer W and moving along the front surface of the wafer W also moves upward together with the above rising flow, and is exhausted to the outside via the exhaust port 324. Accordingly, it is possible to prevent the sublimate from adhering to the rear surface and the bevel of the wafer W.

Note that during the PEB treatment, the upper chamber 301 is heated. This is to prevent the sublimate from re-solidifying and adhering to the upper chamber 301. Further, during the PEB treatment, the treatment gas to be supplied from the shower head 311 is heated by the heated upper chamber 301. On the other hand, during the PEB treatment, the gas to be supplied from the gas supplier 344 toward the wafer W on the hot plate 328 is gas taken into the chamber 300 from the intake port 343 and is gas heated by the hot plate 328 in the buffer space K2 or gas heated by the heated gas. Further, during the PEB treatment, the gas to be supplied from the gas supplier 344 toward the wafer W on the hot plate 328 is heated also by the straightening member 303 heated by the upper chamber 301.

(Step S3*b*: Start of Central Exhaust)

After a lapse of the first predetermined time from the start of the PEB treatment, the exhaust by the central exhauster 317 is started while the discharge of the gas from the shower head 311 and the exhaust by the peripheral exhauster 323 are continued. The first predetermined time is set so that the coating film of the metal-containing resist on the wafer W is solidified to the desired level as explained above. Further, information on the first predetermined time is stored in the storage (not illustrated).

At this stage, the exhaust by the central exhauster 317, the discharge of the treatment gas from the shower head 311, and the exhaust by the peripheral exhauster 323 are performed so that the gas supply by the gas supplier 344 is performed. For example, a control is conducted such that a sum of the exhaust flow rate L2 from the treatment space K1 by the peripheral exhauster 323 and an exhaust L3 by the central exhauster 317 is higher than the discharge flow rate L1 from the shower head 311 to the treatment space K1. In other words, the control is conducted such that L2+L3>L1. Thus, gas corresponding to a flow rate (L2+L3−L1) is taken into the chamber 300 from the outside of the chamber 300 via the intake port 343. Then, the gas corresponding to the flow rate (L2+L3−L1) is supplied from the gas supplier 344 toward the wafer W on the hot plate 328. The flow rate of the gas to be supplied from the gas supplier 344 toward the wafer W on the hot plate 328 is substantially even over the circumferential direction.

Performing the exhaust by the central exhauster 317 forms a flow of the treatment gas from the outer peripheral side of the wafer W toward the central portion of the wafer W in the vicinity of the front surface of the wafer W. Therefore, the treatment gas possibly containing the sublimate near the front surface of the wafer W is exhausted also via the central exhauster 317. Further, the exhaust rate by the central exhauster 317 may be made higher than the exhaust rate by the peripheral exhauster 323 and, in this case, the treatment gas possibly containing the sublimate near the front surface of the wafer W is exhausted mainly via the central exhauster 317. Accordingly, it is possible to further prevent the sublimate from adhering to the rear surface and the bevel of the wafer W. Note that at the stage of performing the exhaust by the central exhauster 317, the solidification of the coating film of the metal-containing resist has been proceeded and the gas flow accompanying the exhaust causes little effect on film thickness variation. Therefore, the exhaust by the central exhauster 317, even if performed, causes little effect on the in-plane uniformity of the film thickness.

(Step S3*c*: Stop of the PEB Treatment)

After a lapse of a second predetermined time from the start of the exhaust by the central exhauster 317, the PEB treatment is ended. Specifically, for example, the upper chamber 301 is raised to bring the chamber 300 into an open state. In this event, the exhaust by the central exhauster 317, the discharge of the treatment gas from the shower head 311, and the exhaust by the peripheral exhauster 323 are continued.

The second predetermined time is set so that the coating film of the metal-containing resist on the wafer W is solidified to a desired level. Information on the second predetermined time is stored in the storage (not illustrated).

Further, the first predetermined time and the second predetermined time are set as follows. Specifically, they are set so that the percentage of a period during which the exhaust by the central exhauster 317 is performed is 1/20 to 1/2 of a total time of the PEB treatment. More specifically, in the case where the total time of the PEB treatment is 60 seconds, they are set so that the period during which the exhaust by the central exhauster 317 is performed is 3 seconds to 30 seconds. The total time of the PEB treatment is, for example, from a time when the upper chamber 301 is lowered after the wafer W is mounted on the hot plate 328 and the chamber 300 is brought into the closed state to a time when the upper chamber 301 is raised to bring the chamber 300 into the open state.

(Step S4: Wafer Transfer-Out)

Thereafter, the wafer W is removed from the top of the hot plate 328 and transferred out to the outside of the thermal treatment apparatus 40 in a procedure reverse to that in mounting the wafer W.

Modification Example

In the above example, the exhaust by the central exhauster 317 is not performed at the start of the PEB treatment but the exhaust by the central exhauster 317 is performed from a middle of the PEB treatment. Instead of the above, the exhaust by the central exhauster 317 is weakly performed at the start of the PEB treatment and the exhaust by the central exhauster 317 may be enhanced from the middle of the PEB treatment.

Further, the controller 200 may conduct a control so that the supply flow rate of the treatment gas to the gas distribution space 313 of the shower head 311 is high during a period during which the exhaust by the central exhauster 317 is performed or a period during which the exhaust by the central exhauster 317 is enhanced (hereinafter, a central exhaust enhancement period) from the middle of the PEB treatment. The reason is as follows.

Figure 9:
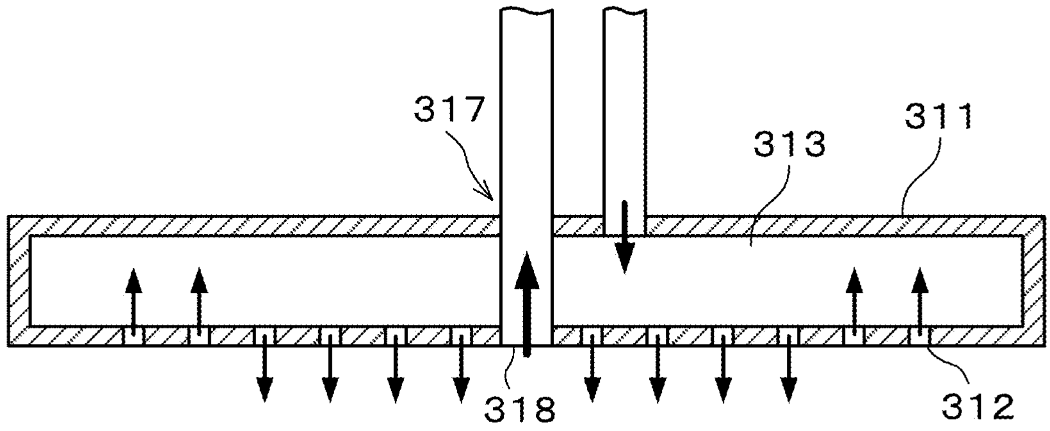
FIG. 9 is a view illustrating an effect of the thermal treatment apparatus according to this embodiment.

The discharge holes 312 on the peripheral edge portion side and the discharge holes 312 on the central portion side share the gas distribution space 313. Further, during the central exhaust enhancement period, the discharge flow rate of the treatment gas from the discharge holes 312 on the central portion side close to the central exhauster 317 (specifically, the exhaust hole 318) is high. Therefore, during the central exhaust enhancement period, the discharge of the treatment gas from the discharge holes 312 on the peripheral edge portion side to the treatment space K1 is not performed and, contrarily, suction of gas from the treatment space K1 through the discharge holes 312 on the peripheral edge portion side is performed in some cases depending on the strength of the exhaust by the central exhauster 317 as illustrated in FIG. 9. Increasing the supply flow rate of the treatment gas to the gas distribution space 313 of the shower head 311 during the central exhaust enhancement period can suppress the suction of the gas from the treatment space K1 through the discharge holes 312 at the peripheral edge portion, namely, a reverse flow of the gas into the shower head 311.

<Main Effects of this Embodiment>

As explained above, in this embodiment, the thermal treatment apparatus 40 includes the hot plate 328 which supports and heats the wafer W, and the chamber 300 which houses the hot plate 328 and has the ceiling 310 facing the wafer W on the hot plate 328. The thermal treatment apparatus 40 further includes the shower head 311 which is provided at the ceiling 310 and discharges the treatment gas toward the wafer W from above, and the gas supplier 344 which supplies gas from below the front surface of the wafer W toward the wafer W. The thermal treatment apparatus 40 further includes the central exhauster 317 which exhausts the treatment space K1 above the hot plate 328 in the chamber 300 from a position close to the center of the wafer W in top view on the ceiling 310, the peripheral exhauster 323 which exhausts the treatment space K1 from a side closer to the peripheral edge portion of the wafer W than the central exhauster 317 in top view on the ceiling 310, and the controller 200. Further, the controller 200 conducts a control so that the discharge by the gas discharger, the supply of the gas by the gas supplier, and the exhaust by the peripheral exhauster are continued during the thermal treatment and the exhaust by the central exhauster is enhanced from the middle of the thermal treatment.

Further, the wafer treatment according to this embodiment includes: mounting the wafer W on the hot plate 328; and thermally treating the wafer W on the hot plate 328. The thermally treating includes:

(A) discharging the treatment gas toward the wafer W from the ceiling 310 facing the wafer W of the chamber 300 which houses the hot plate 328;

(B) supplying gas toward the wafer W from below the front surface of the wafer W;

(C) exhausting the treatment space K1 above the hot plate 328 in the chamber 300 from the position close to the center of the wafer W in top view on the ceiling 310: and (D) exhausting the treatment space K1 from the side closer to the peripheral edge portion of the wafer W than in the (C) in top view on the ceiling 310.

In this wafer treatment, during the thermal treatment, the (A) is continuously performed and the (B) and the (C) are continuously performed to form the rising flow around the wafer W, and the exhaust in the (C) is enhanced from the middle of the thermal treatment.

In other words, in this embodiment, the supply of the treatment gas to the wafer W on the hot plate 328 and the exhaust from the position close to the peripheral edge portion of the wafer W on the hot plate 328 on the ceiling 310 are continued during the thermal treatment. Therefore, it is possible to improve the uniformity within the plane of the thermal treatment. Accordingly, it is possible to suppress the contamination of the bevel and the rear surface of the wafer W by the sublimate produced from the coating film of the resist on the wafer W.

Further, the exhaust from the position close to the peripheral edge portion of the wafer W on the hot plate 328 on the ceiling 310 and the supply of the gas toward the wafer W from below the front surface of the wafer W on the hot plate 328 are continued during the thermal treatment. Therefore, the rising flow is formed at the peripheral edge portion of the wafer W.

Further, in this embodiment, the thermal treatment proceeds and the influence of the exhaust from the position close to the central portion of the wafer W on the hot plate 328 (namely, the central exhaust) on the variation in film thickness decreases, and then the central exhaust excellent in sublimate recovery is performed. Accordingly, it is possible to further suppress the contamination of the wafer W by the sublimate produced from the coating film of the resist on the wafer W.

Therefore, according to this embodiment, it is possible to suppress the contamination of the wafer W by the sublimate produced from the coating film of the resist on the wafer and to improve the uniformity within the wafer of the thermal treatment.

Further, since the rising flow is formed as explained above, according to this embodiment, it is possible to suppress adhesion of the sublimate to members (for example, the chamber 300) located at the periphery of the hot plate 328.

Further, in this embodiment, the gas to be supplied by the gas supplier 344 toward the wafer W on the hot plate 328 from below the front surface of the wafer W on the hot plate 328 is gas heated by the hot plate 328 in the buffer space K2 or gas heated by the heated gas. Further, the buffer space K2 is larger in volume than the treatment space K1. Therefore, the supply of the heated gas to the treatment space K1 can be performed in a period as long as possible. When unheated gas is supplied to the treatment space K1, members (for example, the upper chamber 301) at the periphery of the treatment space K1 are cooled by the gas, whereby the sublimate may solidify in some cases. In this embodiment, since the supply of the heated gas to the treatment space K1 can be performed in a period as long as possible, it is possible to suppress the solidification of the sublimate. Further, the unheated gas, when supplied from the gas supplier 344 toward the wafer W, may affect the thermal treatment on the peripheral edge portion of the wafer W. In contrast to this, in this embodiment, the gas to be supplied from the gas supplier 344 toward the wafer W is heated, and therefore the gas can suppress deterioration in uniformity within the plane of the thermal treatment. On the other hand, since the volume of the treatment space K1 is small, the thermal capacity of the gas inside the treatment space K1 is also small, so that the temperature in the treatment space K1 when the supply of the heated gas to the treatment space K1 is performed for a long time also becomes likely to be stable.

Further, in this embodiment, the upper chamber 301 is configured to be able to heat the upper chamber 301. Further, the entire upper surface of the straightening member 303 is in contact with the lower surface of the upper chamber 301. Therefore, heating the upper chamber 301 can efficiently heat the straightening member 303. Further, the straightening member 303 is a solid body and high in thermal capacity. Therefore, by heating the straightening member 303, the straightening member 303 can efficiently heat the gas to be supplied from the gas supplier 344. Therefore, according to this embodiment, the gas to be supplied from the gas supplier 344 can be heated by the heated upper chamber 301. Accordingly, it is possible to suppress the solidification of the sublimate and the deterioration in uniformity within the plane of the thermal treatment, caused by the gas to be supplied from the gas supplier 344.

Furthermore, in this embodiment, the straightening member 303 is raised and lowered together with the upper chamber 301. Therefore, the straightening member 303 is heated by the upper chamber 301 regardless of the position of the upper chamber 301. More specifically, even when the upper chamber 301 is raises to bring the chamber 300 into the open state in order to mount the wafer W on the hot plate 328, the straightening member 303 is heated by the upper chamber 301. As a result of this, the straightening member 303 can be kept at a high temperature. Therefore, according to this embodiment, even immediately after the chamber 300 is brought into the closed state, the gas to be supplied from the gas supplier 344 can be heated by the straightening member 303. Accordingly, it is possible to suppress the solidification of the sublimate and the deterioration in uniformity within the plane of the thermal treatment, caused by the gas to be supplied from the gas supplier 344.

Further, in this embodiment, the inner peripheral surface of the straightening member 303 linearly extends downward from the ceiling 310 of the upper chamber 301. More specifically, at the inner peripheral side portion of the straightening member 303, no recess recessed toward the outside exists above the lower surface of the inner peripheral side portion, namely, the guide surface. If the recess exists, the gas possibly containing the sublimate stays in the recess to cause particles. In contrast to this, the above recess does not exist, so that the occurrence of the particles can be suppressed.

Note that the form in which the inner peripheral surface of the straightening member 303 extends downward from the ceiling 310 of the upper chamber 301 does have to be completely linear. In other words, the inner peripheral surface of the straightening member 303 may be slightly recessed toward the outside to an extent causing no stay of the gas. For example, an upper end corner portion of the inner peripheral surface of the straightening member 303 is subjected to chamfering in order to suppress breakage of the upper end corner portion and, as a result, the inner peripheral surface of the straightening member 303 may be recessed to the outside. The recess formed by the chamfering in order to suppress breakage of the corner portion is small enough, so that the stay of the gas does not occur and, if occurring, its influence is small.

Further, in this embodiment, the resinous pad 335 communicates with the suction hole 330 via the metal member 334 and is connected to the hot plate 328. Therefore, according to this embodiment, it is possible to suppress the deterioration of the resinous pad 335 due to the heat from the hot plate 328 as compared with the case where the resinous pad 335 is directly connected to the hot plate 328.

<Verification Test>

Figure 10:
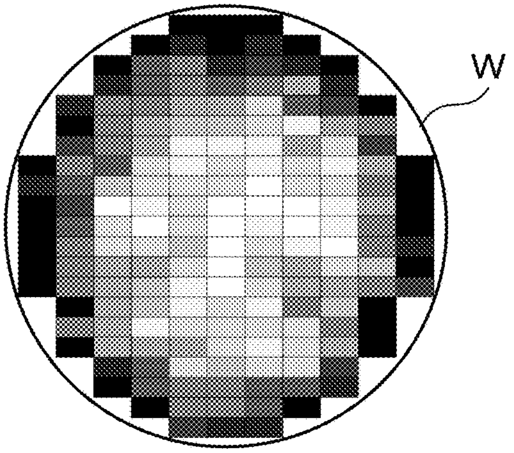
FIG. 10 is a view illustrating a result of a verification test.
Figure 11:
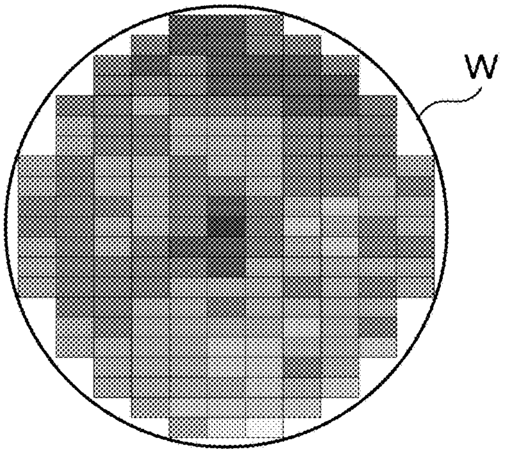
FIG. 11 is a view illustrating a result of the verification test.
Figure 12:
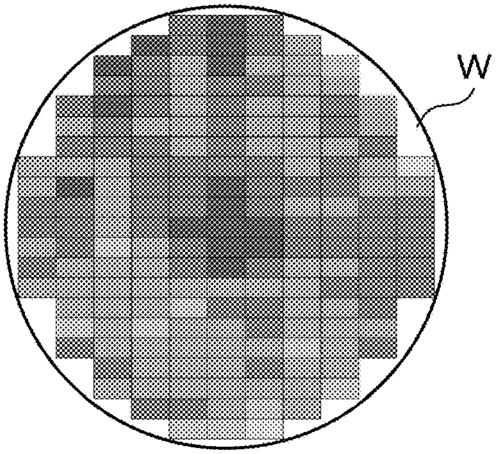
FIG. 12 is a view illustrating a result of the verification test.

A test of measuring the line width of a resist pattern of the metal-containing resist and the number of metal atoms at the rear surface and the bevel of the wafer W was carried out in following Cases 1 to 3. FIG. 10 to FIG. 14 are views an charts each illustrating each test result. FIG. 10 to FIG. 12 illustrate the thickness of the line width of the resist pattern by shades of black. The vertical axis of FIG. 13 indicates 30 of the line width of the resist pattern representing the in-plane uniformity (CDU: Critical Dimension Uniformity) of the line width of the resist pattern on a linear scale. The vertical axis of FIG. 14 indicates the number of metal atoms per unit area on a logarithmic scale.

(Case 1)

A conventional thermal treatment apparatus not having the gas supplier 344 was used. The exhaust by the central exhauster 317 and the discharge of the treatment gas from the shower head 311 were performed but the exhaust by the peripheral exhauster 323 was not performed during the PEB treatment.

(Case 2)

The thermal treatment apparatus 40 illustrated in FIG. 4 and so on was used. The exhaust by the peripheral exhauster 323 and the discharge of the treatment gas from the shower head 311 were performed such that gas was supplied from the gas supplier 344 continuously from the start to the end of the PEB treatment. Further, the exhaust by the central exhauster 317 was not performed at all during the PEB treatment.

(Case 3)

The thermal treatment apparatus 40 illustrated in FIG. 4 and so on was used. The exhaust by the peripheral exhauster 323 and the discharge of the treatment gas from the shower head 311 were performed such that the gas was supplied from the gas supplier 344 continuously from the start to the end of the PEB treatment. Further, the exhaust by the central exhauster 317 was performed from the middle of the PEB treatment to the end of the PEB treatment.

Note that in any of Cases 1 to 3, the developing treatment and the POST treatment were performed after the PEB treatment to form the resist pattern of the metal-containing resist, and then the measurement of the line width of the resist pattern and the measurement of the number of metal atoms at the rear surface and the bevel of the wafer W were performed.

In Case 1, as illustrated in FIG. 10, there was a great difference in the line width of the resist pattern between the central portion and the peripheral edge portion of the wafer W. In contrast to the above, in Case 2 and Case 3, as illustrated in FIG. 11 and FIG. 12, there was a little or no difference in the line width of the resist pattern between the central portion and the peripheral edge portion of the wafer W.

Figure 13:
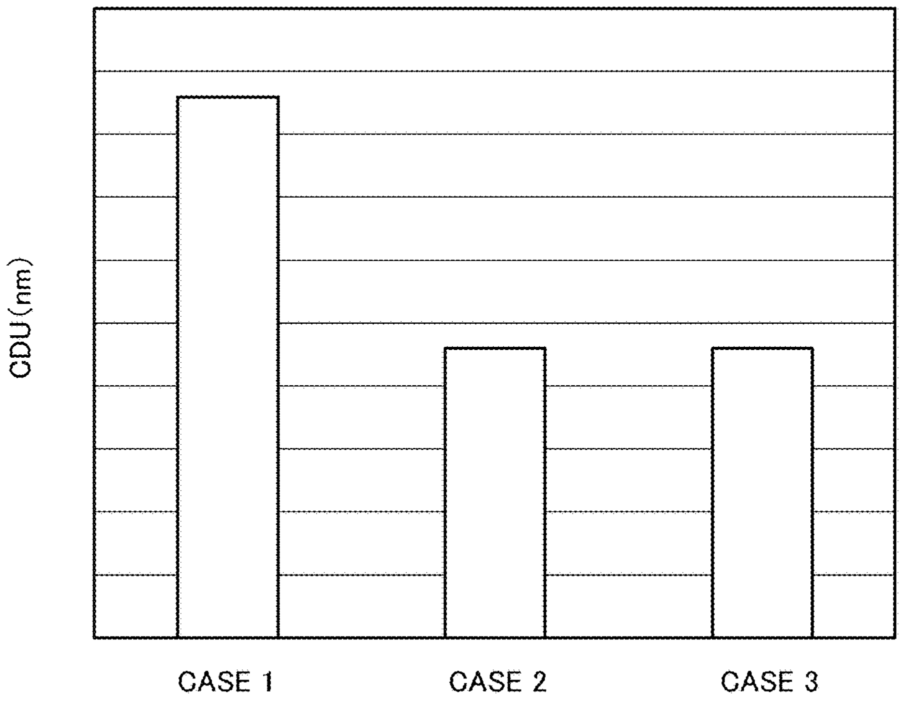
FIG. 13 is a chart illustrating a result of the verification test.

Further, as illustrated in FIG. 13, in Case 2 and Case 3, 36 (o is the line width of the resist pattern) representing the in-plane uniformity (CDU) of the line width of the resist pattern was about half that of Case 1.

Figure 14:
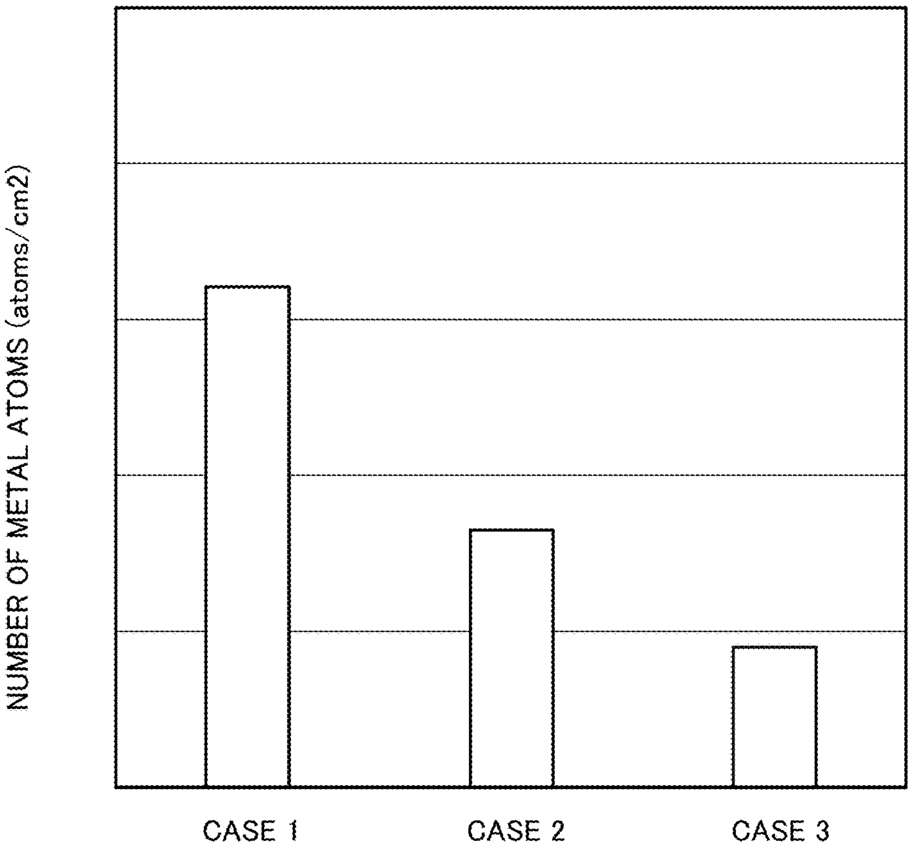
FIG. 14 is a chart illustrating a result of the verification test.

Further, as illustrated in FIG. 14, in Case 2, the number of metal atoms at the rear surface and the bevel of the wafer W was about 1/10that of Case 1.

In contrast to the above, in Case 3, the number of metal atoms at the rear surface and the bevel of the wafer W was about 1/100that of Case 1.

These results also reveal that it is possible, according to this embodiment, to suppress the contamination of the wafer W by the sublimate produced from the coating film of the resist on the wafer W and improve the uniformity within the wafer of the thermal treatment.

The embodiment disclosed herein is an example in all respects and should not be considered to be restrictive. Various omissions, substitutions and changes may be made in the embodiment without departing from the scope and spirit of the attached claims.

EXPLANATION OF CODES

40 thermal treatment apparatus
200 controller

300 chamber
310 ceiling
311 shower head
317 central exhauster
323 peripheral exhauster
328 hot plate
344 gas supplier
K1 treatment space
W wafer

What is claimed is:

1. A thermal treatment apparatus for thermally treating a substrate on which a coating film of a resist has been formed and the coating film has been subjected to an exposure treatment, the thermal treatment apparatus comprising:

a hot plate configured to support and heat the substrate;

a chamber configured to house the hot plate, the chamber having a ceiling forming thereunder a treatment space in which the thermal treatment is performed, and facing the substrate on the hot plate;

a gas discharger provided at the ceiling and configured to discharge a treatment gas toward the substrate on the hot plate from above;

a gas supplier configured to supply gas toward the substrate on the hot plate from a lateral side of the substrate on the hot plate and a lower portion of the treatment space;

a central exhauster configured to exhaust the treatment space in the chamber from a position close to a center of the substrate on the hot plate in top view on the ceiling;

a peripheral exhauster configured to exhaust the treatment space from a side closer to a peripheral edge portion of the substrate on the hot plate than the central exhauster in top view on the ceiling; and a controller, wherein the controller conducts a control so that the discharge by the gas discharger, the supply of the gas by the gas supplier, and the exhaust by the peripheral exhauster are continued during the thermal treatment and the exhaust by the central exhauster is enhanced, after a start of the thermal treatment, for a predetermined period, the predetermined period being $\frac{1}{20}$ to $\frac{1}{2}$ of a total duration of the thermal treatment, the gas supplier has:

a gas flow path provided in a manner to surround a side surface of the hot plate; and a straightening member configured to cause gas rising along the gas flow path to go toward the substrate on the hot plate.

2. The thermal treatment apparatus according to claim 1, wherein the resist is a metal-containing resist.

3. The thermal treatment apparatus according to claim 1, wherein:

the gas flow path is connected to a buffer space below the hot plate in the chamber; and the buffer space is larger in volume than the treatment space.

4. The thermal treatment apparatus according to claim 1, wherein:

the chamber has an upper chamber which includes the ceiling and which is configured to be freely raised and lowered;

the upper chamber is configured to be able to heat the upper chamber; and the straightening member is a solid body, and an entire upper surface thereof is in contact with a lower surface of the upper chamber.

5. The thermal treatment apparatus according to claim 1, wherein:

the chamber has an upper chamber which includes the ceiling and which is configured to be freely raised and lowered;

the upper chamber is configured to be able to heat the upper chamber; and the straightening member is a solid body, is fixed to the upper chamber in a form where an entire upper surface thereof is in contact with a lower surface of the upper chamber, and is raised and lowered together with the upper chamber.

6. The thermal treatment apparatus according to claim 1, wherein:

the hot plate has a suction hole for sucking the substrate to the hot plate;

a resinous pad having a flow path communicating with the suction hole is further provided; and the resinous pad communicates with the suction hole and is connected to the hot plate via a metal member.

7. The thermal treatment apparatus according to claim 6, wherein a cross-sectional area of a suction flow path toward the suction hole is enlarged in the metal member.

8. The thermal treatment apparatus according to claim 6, further comprising an annular member connected to a lower portion of the hot plate via a supporting post, wherein the resinous pad is located below the annular member.

9. The thermal treatment apparatus according to claim 1, wherein:

the gas discharger has:

a first discharge hole located above the peripheral edge portion of the substrate on the hot plate;

a second discharge hole located above a central portion of the substrate on the hot plate; and a gas distribution space in which the supplied treatment gas is distributed to the first discharge hole and the second discharge hole; and the controller conducts a control so that a flow rate of the treatment gas to be supplied to the gas distribution space is increased during a period during which the exhaust by the central exhauster is enhanced.

10. A thermal treatment method for thermally treating a substrate on which a coating film of a resist has been formed and the coating film has been subjected to an exposure treatment, the thermal treatment method comprising:

mounting the substrate on a hot plate configured to support and heat the substrate; and thermally treating the substrate on the hot plate, the thermally treating comprising:

(A) discharging a treatment gas toward the substrate on the hot plate from a ceiling of a chamber which houses the hot plate facing the substrate on the hot plate and forming thereunder a treatment space in which the thermal treatment is performed;

(B) supplying gas toward the substrate on the hot plate from a lateral side of the substrate on the hot plate and a lower portion of the treatment space;

(C) exhausting the treatment space in the chamber from a position close to a center of the substrate on the hot plate in top view on the ceiling; and (D) exhausting the treatment space from a side closer to a peripheral edge portion of the substrate on the hot plate than in the (C) in top view on the ceiling, wherein during the thermal treatment, the (A) is continuously performed and the (B) and the (D) are continuously performed to form a rising flow around the substrate on the hot plate, and the exhaust in the (C) is enhanced, after a start of the thermal treatment, for a predetermined period, the predetermined period being 1/20 to 1/2 of a total duration of the thermal treatment, in the (B), a straightening member causes gas rising along a gas flow path provided in a manner to surround a side surface of the hot plate, to go toward the substrate on the hot plate.

11. The thermal treatment method according to claim 10, wherein the resist is a metal-containing resist.

12. The thermal treatment method according to claim 10, wherein:

the gas flow path is connected to a buffer space below the hot plate in the chamber; and in the (B), gas in the buffer space heated by the hot plate is supplied toward the substrate on the hot plate; and the buffer space is larger in volume than the treatment space.

13. The thermal treatment method according to claim 10, wherein:

the chamber has an upper chamber which includes the ceiling and which is configured to be freely raised and lowered;

the upper chamber is configured to be able to heat the upper chamber;

the straightening member is a solid body, an entire upper surface thereof is in contact with a lower surface of the upper chamber, and is heated by the upper chamber; and in the (B), gas heated by the straightening member is supplied toward the substrate on the hot plate.

14. The thermal treatment method according to claim 10, wherein:

the chamber has an upper chamber which includes the ceiling and which is configured to be freely raised and lowered;

the upper chamber is configured to be able to heat the upper chamber;

the straightening member is a solid body, is fixed to the upper chamber in a form where an entire upper surface thereof is in contact with a lower surface of the upper chamber, is raised and lowered together with the upper chamber, and is heated by the upper chamber regardless of a position in an up-down direction of the heated upper chamber; and in the (B), gas heated by the straightening member is supplied toward the substrate on the hot plate.

15. The thermal treatment method according to claim 10, wherein:

the hot plate has a suction hole for sucking the substrate to the hot plate, a resinous pad having a flow path communicating with the suction hole is further provided; and the resinous pad communicates with the suction hole and is connected to the hot plate via a metal member.

16. The thermal treatment method according to claim 15, wherein a cross-sectional area of a suction flow path toward the suction hole is enlarged in the metal member.

17. The thermal treatment method according to claim 10, wherein:

in the (A), the treatment gas supplied to a gas distribution space is distributed to a first discharge hole located above the peripheral edge portion of the substrate on the hot plate and a second discharge hole located above a central portion of the substrate on the hot plate, and is discharged via the first discharge hole and the second discharge hole; and a flow rate of the treatment gas to be supplied to the gas distribution space is increased during a period during which the exhaust by the (C) is enhanced.

18. A computer-readable storage medium storing a program running on a computer of a controller configured to control a thermal treatment apparatus in order to cause the thermal treatment apparatus to execute a thermal treatment method for thermally treating a substrate on which a coating film of a resist has been formed and the coating film has been subjected to an exposure treatment, the thermal treatment method comprising:

mounting the substrate on a hot plate configured to support and heat the substrate; and thermally treating the substrate on the hot plate, the thermally treating comprising:

(A) discharging a treatment gas toward the substrate on the hot plate from a ceiling of a chamber which houses the hot plate facing the substrate on the hot plate and forming thereunder a treatment space in which the thermal treatment is performed;

(B) supplying gas toward the substrate on the hot plate from a lateral side of the substrate on the hot plate and a lower portion of the treatment space;

(C) exhausting the treatment space in the chamber from a position close to a center of the substrate on the hot plate in top view on the ceiling; and (D) exhausting the treatment space from a side closer to a peripheral edge portion of the substrate on the hot plate than in the (C) in top view on the ceiling, wherein during the thermal treatment, the (A) is continuously performed and the (B) and the (D) are continuously performed to form a rising flow around the substrate on the hot plate, and the exhaust in the (C) is enhanced, after a start of the thermal treatment, for a predetermined period, the predetermined period being 1/20 to 1/2 of a total duration of the thermal treatment, in the (B), a straightening member is provided that causes gas rising along a gas flow path provided in a manner to surround a side surface of the hot plate, to go toward the substrate on the hot plate.

* * * * *